United States Patent
Kurino

[19]

[11] Patent Number: 6,093,595
[45] Date of Patent: Jul. 25, 2000

[54] METHOD OF FORMING SOURCE AND DRAIN REGIONS IN COMPLEMENTARY MOS TRANSISTORS

[75] Inventor: Hiroyuki Kurino, Miyagi, Japan

[73] Assignee: Texas Instruments Incorporated, Dallas, Tex.

[21] Appl. No.: 09/162,716

[22] Filed: Sep. 29, 1998

Related U.S. Application Data

[60] Provisional application No. 60/060,275, Sep. 29, 1997.

[51] Int. Cl.[7] .................................................. H01L 21/8238
[52] U.S. Cl. ......................... 438/231; 438/230; 438/202; 438/203; 438/207
[58] Field of Search ................................ 438/231, 202, 438/203, 207, 218, 225, 230

[56] References Cited

U.S. PATENT DOCUMENTS

| | | | |
|---|---|---|---|
| 4,843,023 | 6/1989 | Chiu et al. | 438/231 |
| 5,006,477 | 4/1991 | Farb | 438/231 |
| 5,015,595 | 5/1991 | Wollensen | 438/231 |
| 5,024,959 | 6/1991 | Pfiester | 438/231 |
| 5,956,591 | 9/1999 | Fulford | 438/230 |

*Primary Examiner*—Charles Bowers
*Assistant Examiner*—David S Blum
*Attorney, Agent, or Firm*—Robby T. Holland; Carlton H. Hoel; Frederick J. Telecky, Jr.

[57] ABSTRACT

A method of forming a complementary metal-oxide-semiconductor (CMOS) integrated circuit, and the integrated circuit so formed, are disclosed. After the formation of a p-type well (4) and an n-type well (6) into which the transistors are to be formed; and gate structures (8n, 8p) overlying the surfaces of these wells (4, 6), a doped insulating layer (20) is formed overall, for example by way of chemical vapor deposition. The doped insulating layer (20) is, according to the preferred embodiment of the invention, silicon dioxide that is doped with boron. In the preferred embodiment of the invention, the portion of the doped insulating layer (20) overlying the p-type well (4) is removed, and ion implantation of n-type dopant is then performed. The remaining portion of the doped insulating layer (20) protects the n-type well (6) from the n-type ion implantation steps. The structure is then heated to diffuse dopant from the doped insulating layer (20) into n-type well (6) at its surface, in a self-aligned manner relative to the gate structure (8n) thereat. The process provides a CMOS structure that can be fabricated with at least one fewer photolithography operation than in conventional methods.

8 Claims, 5 Drawing Sheets

METHOD OF FORMING SOURCE AND DRAIN REGIONS IN COMPLEMENTARY MOS TRANSISTORS

CROSS-REFERENCE TO RELATED APPLICATIONS

This application claims benefit to provisional application No. 60/060,275, filed Sep. 29, 1997.

STATEMENT REGARDING FEDERALLY SPONSORED RESEARCH OR DEVELOPMENT

Not applicable.

BACKGROUND OF THE INVENTION

This invention is in the field of integrated circuit fabrication, and is more specifically directed to the fabrication of integrated circuits according to complementary-metal-oxide-semiconductor (CMOS) technology.

The use of complementary-metal-oxide-semiconductor (CMOS) integrated circuit technology has become widespread over recent years, due to the significant improvements in speed-power product provided by this technology. As is fundamental in the art, CMOS integrated circuits include metal-oxide-semiconductor (MOS) transistors of both p-channel and n-channel types within each basic logic building block, by way of which digital logic operations may be carried out at relatively high switching speeds and extremely low static power dissipation. A well-known extension of CMOS technology is bipolar-CMOS (BiCMOS) technology, in which bipolar transistors are integrated with the p-channel and n-channel MOS transistors to provide even higher switching speeds and high-power drive characteristics.

However, the presence of both p-channel and n-channel transistors in the same integrated circuit increases the complexity of the manufacturing process of CMOS devices, from that required to fabricate integrated circuit devices that have only n-channel or p-channel devices. Fundamentally, each doping step performed for a single channel type device must be repeated for the opposite channel type device. These doping steps include not only the doping of source/drain regions for the MOS devices, but also the doping of both n-type and p-type wells, or tanks, into which the transistors (p-channel and n-channel, respectively) are formed, and additionally, in the case of polysilicon gate devices, the doping of both n-type and p-type polysilicon gate electrodes.

Source/drain doping operations are conventionally carried out by way of ion implantation, for each conductivity type, followed by high temperature annealing, as is well known in the art. In conventional CMOS processes, the source/drain implants are masked so that the implant of one conductivity type does not counterdope the source/drain regions of transistors of the opposite conductivity type. Referring now to FIGS. 1a through 1e, an example of a conventional CMOS process will now be described to illustrate the complex masking that is typically performed.

Figure 1A:
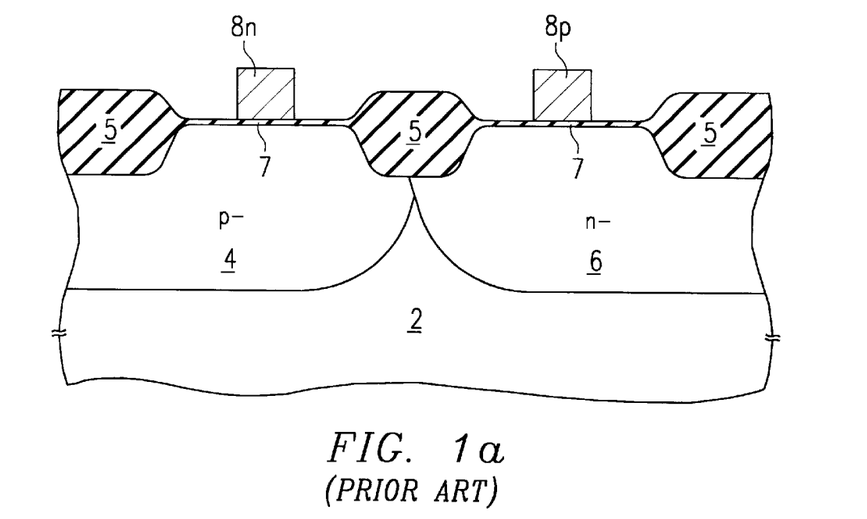
FIGS. 1a through 1e are cross-sectional views illustrating the construction of an integrated circuit according to the prior art.

FIG. 1a is a cross-sectional view of an integrated circuit that has been partially fabricated according to a conventional CMOS process. At this point in the process, substrate 2, which is typically a very lightly-doped (p-type) body of single crystal silicon in wafer form, has wells 4, 6 formed at its surface. P-type well 4 is a lightly-doped p-type region of substrate 2, while n-type well 6 is a lightly-doped n-type region of substrate 2. Field oxide structures 5 have also been formed at the surface of substrate 2, for example by way of local oxidation of silicon (LOCOS), and serve as isolation structures for active source/drain regions that will subsequently be formed. Gate dielectric 7 overlies those portions of the surface of wells 4, 6 that are not occupied by field oxide structures 5; gate dielectric 7 is typically formed of thermal silicon dioxide (grown from substrate 2), deposited silicon dioxide or silicon nitride, or a combination thereof. Also at the point of this conventional process that is illustrated in FIG. 1a, gate structures 8n, 8p are in place at selected locations of wells 4, 6, respectively, separated therefrom by gate dielectric 7. Gate structures 8n, 8p may be formed according to any one of a number of different approaches that are known in the art. For example, gate structures 8n, 8p may be formed of doped polycrystalline silicon (n-type and p-type, respectively), of a refractory metal (e.g., tungsten) or metal silicide (e.g., tungsten disilicide), or of a combination of materials, such combinations also being known in the art. In addition, additional processing such as channel stop implants (under field oxide structures 5) and threshold voltage adjust implants will typically have been performed at the state of manufacture illustrated in FIG. 1a. For example, threshold voltage adjust implants are typically performed into the active regions of wells 4, 6 (i.e., those regions at which field oxide structures 5 are not present), prior to the formation of gate structures 8.

In this conventional process, as is now standard for modern MOS processing, n-channel transistors will be formed into well 4 so as to have a graded junction, also referred to as "lightly-doped drain" junction. According to this approach, the source/drain regions for n-channel transistors are formed so as to be relatively lightly-doped and shallow at locations directly adjacent to the gate, and more heavily-doped and deeper at locations spaced away from the gate. This construction is preferred for n-channel transistors to prevent the occurrence of "hot carrier effects" that can deleteriously change the operating parameters of the transistor over time.

Figure 1B:
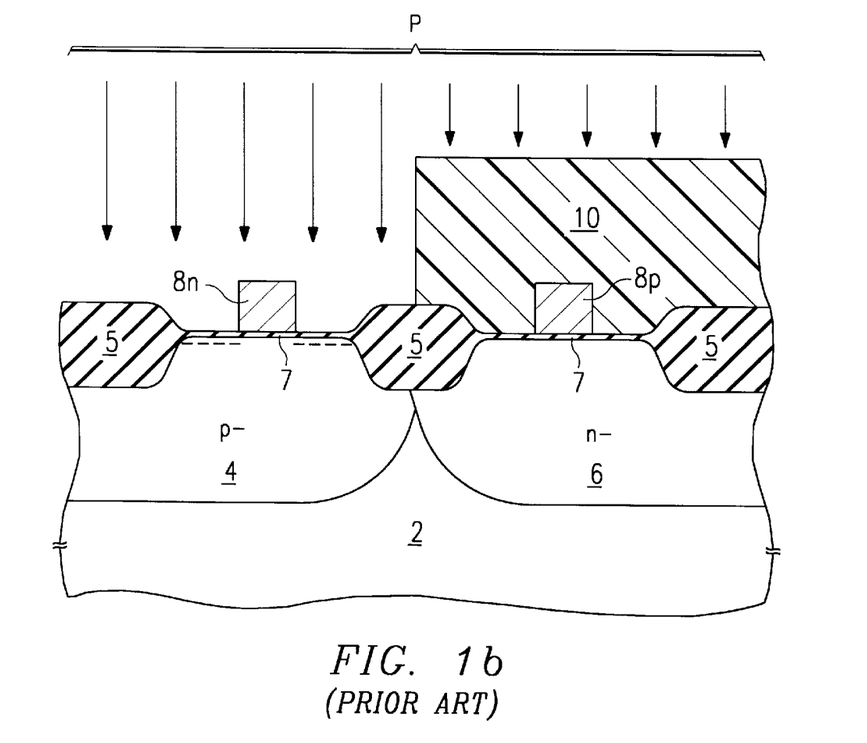

Referring now to FIG. 1b, photoresist 10 is illustrated as in place over those portions of well 6 at which p-channel MOS transistors are to be formed. Photoresist 10 is formed by conventional deposition and spinning of photoresist to a thickness sufficient to stop ions in the subsequent implant operation from penetrating therethrough; masking, patterning, and developing of the photoresist 10 is then performed to define the locations at which photoresist 10 is to remain. As illustrated in FIG. 1b, the structure is then subjected to a phosphorous ion implant, at a dose and energy selected to provide the lightly-doped drain extensions of the source/drain regions, for prevention of hot carrier effects as noted above. This implant is commonly referred to as the "reach-through" implant. As a result of this implant, well 4 has phosphorous ions located in a thin layer near its surface at those locations not masked by field oxide structures 5, photoresist 10, or gate structure 8n.

Figure 1C:
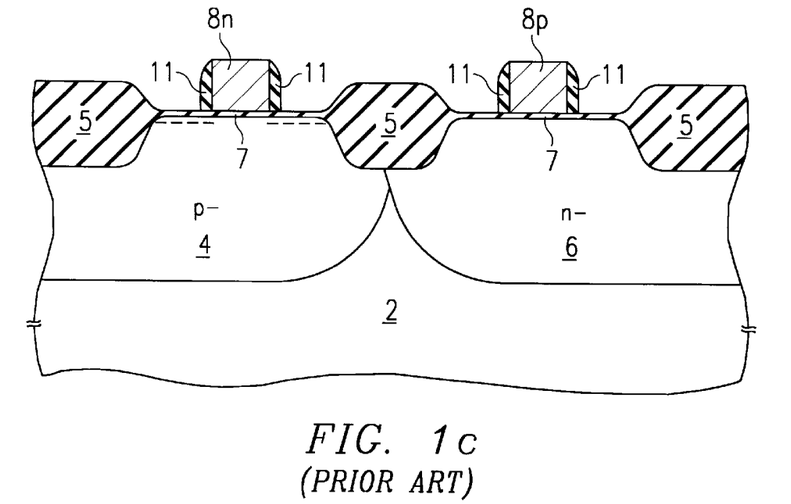

FIG. 1c illustrates the structure after removal of photoresist 10 from the surface of the integrated circuit, including from over well 6. Sidewall dielectric filaments 11 are then formed along the sides of gate structures 8n, 8p, by the deposition of a conformal silicon dioxide or silicon nitride layer, followed by an anisotropic etch to remove the deposited dielectric from the planar surfaces of the structure, leaving filaments 11 as illustrated in FIG. 1c. Sidewall filaments 11 serve to define the location at which the heavy source/drain implants are spaced away from the gate electrode, particularly in the case of the n-channel transistor formed in p-well 4, as n-channel devices are particularly susceptible to hot electron effects. As in this example, lightly-doped drain extensions are not necessary for p-channel devices, as the lower mobility of holes renders p-channel devices much less susceptible to hot carrier effects.

Figure 1D:
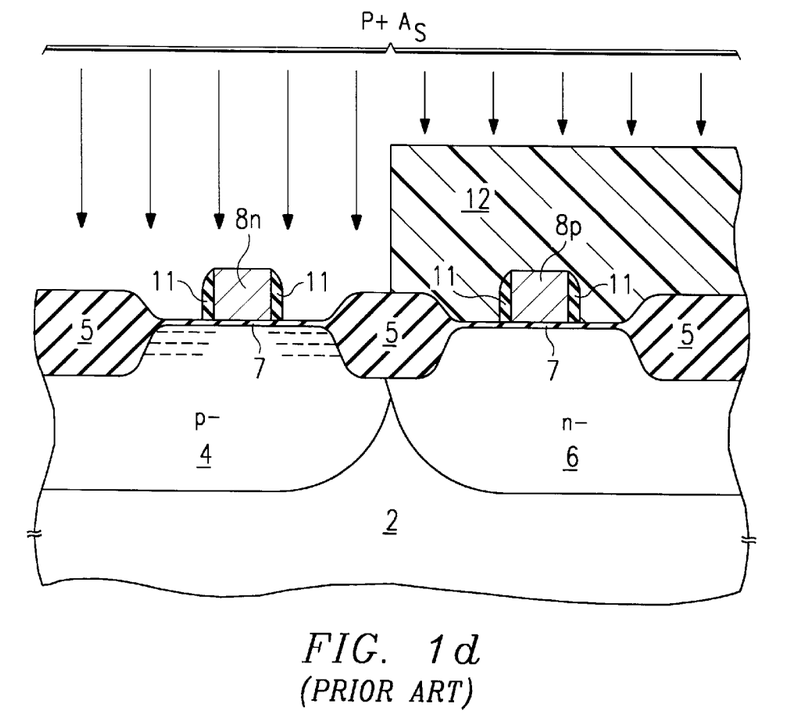

The n-type source/drain implant is next performed, as illustrated in FIG. 1d. As in the case of the lightly-doped drain implant, photoresist 12 is applied and patterned so as to protect n-well 6 (at which the p-channel transistors will be formed) from the n+ source/drain implant, which is typically performed with a relatively heavy dose and energy. The n-type source/drain implant species may be phosphorous or arsenic; alternatively, an implant of each of both species may be performed, as illustrated in FIG. 1d, depending upon the particular junction profile desired.

Figure 1E:
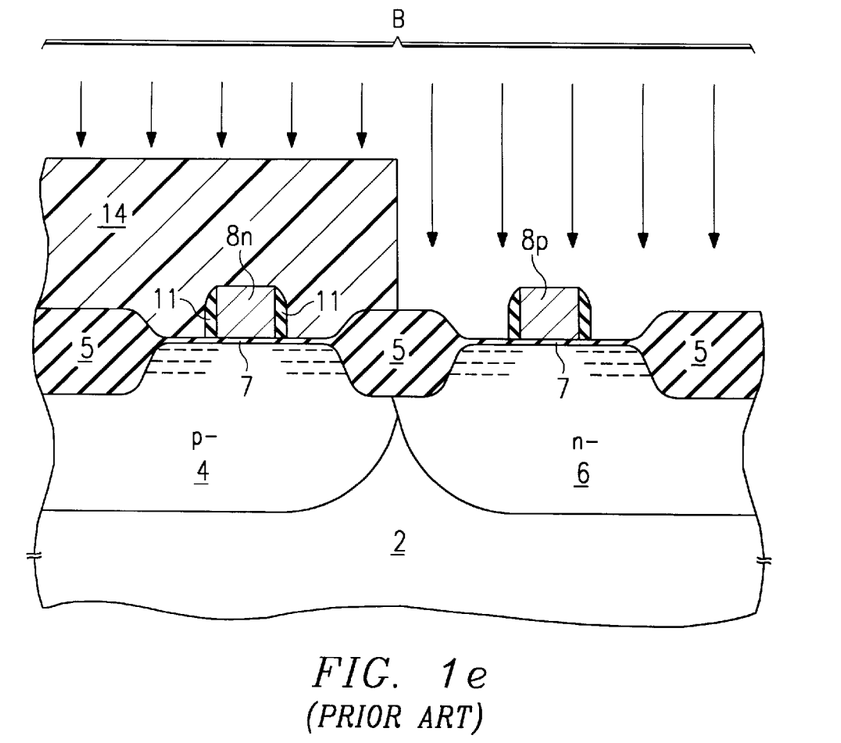

Conventional CMOS processing then continues with the formation of the p-type source/drain regions by way of a masked ion implantation. As shown in FIG. 1e, photoresist 14 is applied over the surface of the integrated circuit structure, and is patterned to protect the surface of p-well 4 (at which the n-channel transistors are formed) from the p-type implant. Ion implantation of the p-type species, typically boron, is then performed, at a relatively heavy dose.

Following the masked implants described hereinabove relative to FIGS. 1a through 1e, photoresist 14 is removed, and the structure is subjected to a high-temperature anneal to drive-in the implanted dopant and form the source/drain junctions. Conventional anneals include furnace anneals, and also rapid thermal anneal (RTA) by way of which the wafer is subjected to an extremely high temperature anneal for a brief period.

As is evident from the foregoing description of the conventional process, multiple photolithographic operations are required to pattern the various implants. Especially as the desired critical dimensions of transistors continue to shrink within the submicron regime, for example to on the order of 0.25 $\mu$, the cost associated with each photolithography operation continues to increase. Elimination of photolithographic operations from the process is therefore desirable to reduce manufacturing cost.

By way of further background, the diffusion of dopant from doped silicon dioxide layers into adjacent silicon semiconductor material is a well-known phenomenon in the art. In this regard, the inclusion of barrier layers (e.g., undoped silicon dioxide, or other materials) between doped silicon dioxide and the silicon bulk has been proposed to prevent such diffusion.

BRIEF SUMMARY OF THE INVENTION

It is therefore an object of the present invention to provide a process for manufacturing an integrated circuit according to a complementary metal-oxide-semiconductor (CMOS) process in which the number of photolithography operations is reduced.

It is a further object of the present invention to provide such a process that is particularly suitable for the manufacture of such integrated circuits having extremely small devices, such as those having channel lengths of on the order of 0.25 $\mu$.

It is a further object of the present invention to provide such a process in which the formation of extremely shallow source/drain junctions may be effected.

Other objects and advantages of the present invention will be apparent to those of ordinary skill in the art having reference to the following specification together with its drawings.

According to the present invention, source/drain regions of metal-oxide-semiconductor (MOS) transistors may be formed by disposing a doped insulating layer, such as silicon dioxide, over those portions of the integrated circuit at which the transistors are to be formed. The doped insulating layer is used as a hard mask for ion implantation of the opposite conductivity type species from that within the doped silicon dioxide layer. Following the implantation of the opposite type species, an anneal is performed both to drive in the implanted species, and also to diffuse dopant from the overlying doped insulating layer into the underlying active regions, forming source and drain regions therein.

DETAILED DESCRIPTION OF THE INVENTION

Figure 2:
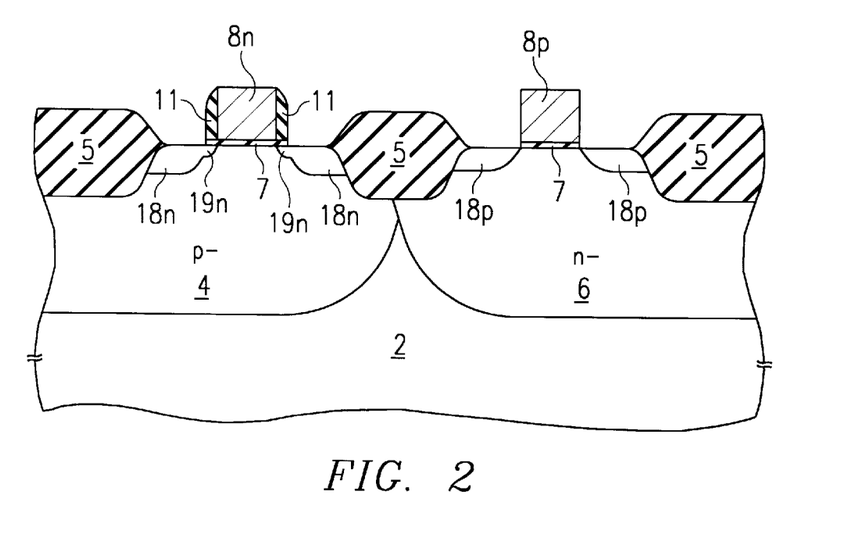
FIG. 2 is a cross-sectional view of a partially fabricated integrated circuit, fabricated according to the preferred embodiment of the present invention.
Figure 3:
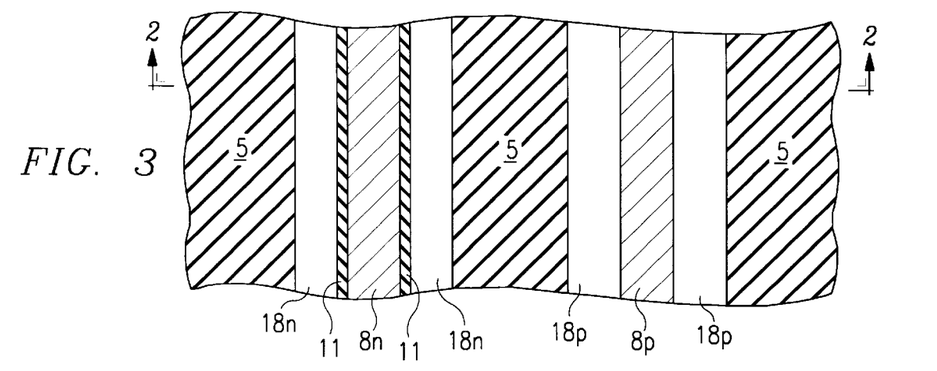
FIG. 3 is a plan view of the partially fabricated integrated circuit of FIG. 2, fabricated according to the preferred embodiment of the present invention.

Referring now to FIGS. 2 and 3 in combination, a complementary metal-oxide-semiconductor (CMOS) integrated circuit structure, formed at a surface of a wafer, according to the preferred embodiment of the present invention, will now be described in detail. Similar elements as previously described relative to FIGS. 1a through 1e are illustrated in FIGS. 2 and 3 (and in the remaining Figures) using the same reference numerals, for convenience and clarity.

The relatively simple example of the integrated circuit structure illustrated in FIGS. 2 and 3, having a single p-channel transistor and a single n-channel transistor, is presented herein for purposes of explanation of the preferred embodiment of the invention, it being understood that modern integrated circuits may include up to on the order of one million or more transistors in a single integrated circuit. Furthermore, the structure illustrated in FIGS. 2 and 3 does not include interconnections, such as those provided by one or more levels of metal, polysilicon, or other conductive materials as conventionally used in modern integrated circuits, as it is contemplated that those of ordinary skill in the art will be readily able to incorporate such interconnection technology as desired in connection with the preferred embodiment of the invention described herein. Still furthermore, the structure according to the preferred embodiment of the invention may be integrated with other structures, such as capacitors for dynamic random access memories (DRAMs), resistors, bipolar transistors (i.e., in a so-called BiCMOS technology), and the like, as is known in the art. In addition, while the exemplary integrated circuit structure according to the preferred embodiment of the invention is described herein as realized in a bulk silicon integrated circuit, it will be understood by those in the art that the present invention is also applicable to other substrate technologies, such as those incorporating epitaxially-formed wells or tanks, and those of the silicon-on-insulator (SOI) type.

The cross-sectional view of FIG. 2 and the corresponding plan view of FIG. 3 illustrate an integrated circuit that has been partially fabricated according to the referred embodiment of the invention. In this example, no metallization or other interconnect layer has been formed, as noted above; it will be understood by those of ordinary skill in the art, however, that the subsequent processing performed to incorporate one or more interconnection layers, as well as other elements such as capacitors (in DRAM integrated circuits), resistors, and the like will not materially change the construction of the transistors from that illustrated in FIGS. 2 and 3.

In this example, substrate 2 is a very lightly-doped (p-type) body of single crystal silicon, in wafer form, with wells 4, 6 at its surface. P-type well 4 is a lightly-doped p-type region of substrate 2, while n-type well 6 is a lightly-doped n-type region of substrate 2. Field oxide structures 5 are present at the surface of substrate 2, having been formed by way of local oxidation of silicon (LOCOS). In the conventional manner, field oxide structures 5 serve as isolation structures for source/drain regions 18n, 18p that are formed at the surface of wells 4, 6, respectively, according to the preferred embodiment of the invention as will be described in detail hereinbelow.

Source/drain regions 18n, 18p are present at the surface of wells 4, 6, respectively, at locations defined in a self-aligned manner by gate structures 8n, 8p. Gate structures 8n, 8p may consist of doped polycrystalline silicon (n-type and p-type, respectively), of a refractory metal (e.g., tungsten), of metal silicide (e.g., tungsten disilicide), or of a combination of such materials, as known in the art. Gate dielectric 7 is a thin layer of dielectric material such as thermal silicon dioxide, deposited silicon dioxide, silicon nitride, or a combination thereof, which is disposed between gate structure 8n and the underlying surface of well 4, in the conventional manner for insulated-gate-field-effect-transistors (IGFETs).

According to this preferred embodiment of the invention, sidewall filaments 11 are present along the sides of gate structure 8n, and may consist of silicon dioxide, silicon nitride, or a combination thereof. N-type source/drain regions 18n are disposed within well 4 on either side of gate structure 8n and sidewall filaments 11, in a self-aligned manner. Source/drain regions 18n are relatively heavily doped n-type regions, while source/drain extensions 19n are more lightly-doped n-type regions that extend from source/drain regions 18n under sidewall filaments 11. Source/drain extensions 19n thus provide a graded junction for the n-channel transistor, so as to prevent transistor parameter degradation from hot electron effects, as are well known in the art, particularly in n-channel transistors of submicron channel lengths.

On the p-channel transistor side, p-type source/drain regions 18p are located at the surface of well 6, on either side of and self-aligned with gate structure 8p. Gate structure 8p is similarly constructed as gate structure 8n; in the case where gate structures 8 are formed of polycrystalline silicon, however, gate structure 8p will be doped p-type while gate structure 8n is doped n-type. In this example, since p-channel transistors are generally not susceptible to hot carrier effects, no source/drain extensions or sidewall filaments are in place. Again, gate dielectric 7 separates gate structure 8p from the surface of well 6 in the channel region between source/drain regions 18p.

It is contemplated that, according to the preferred embodiment of the present invention, the diffusion profile of n-type source/drain regions 18n may differ somewhat from p-type source/drain regions 18p. For example, it is contemplated that the n-type source/drain regions 18n in this exemplary example, formed by conventional ion implantation and drive-in diffusion as described hereinabove relative to FIGS. 1a through 1d, may have a substantially Gaussian profile that is centered at the mean implant depth from the surface; in contrast, it is contemplated that p-type source/drain regions 18p may have a Gaussian diffusion profile with a peak at the surface of well 6, as the dopant in p-type source/drain regions 18p diffuses into well 6 from its surface, as will become apparent from the following description.

In this example of the preferred embodiment of the invention, the transistor dimensions are extremely small. For example, the channel length (which roughly corresponds to the width of gate structures 8n, 8p) may be on the order of 0.25 $\mu$, and the junction depths of n-type source/drain regions 18n and p-type source/drain regions 18p will also be of sub-micron dimensions.

Figure 4A:
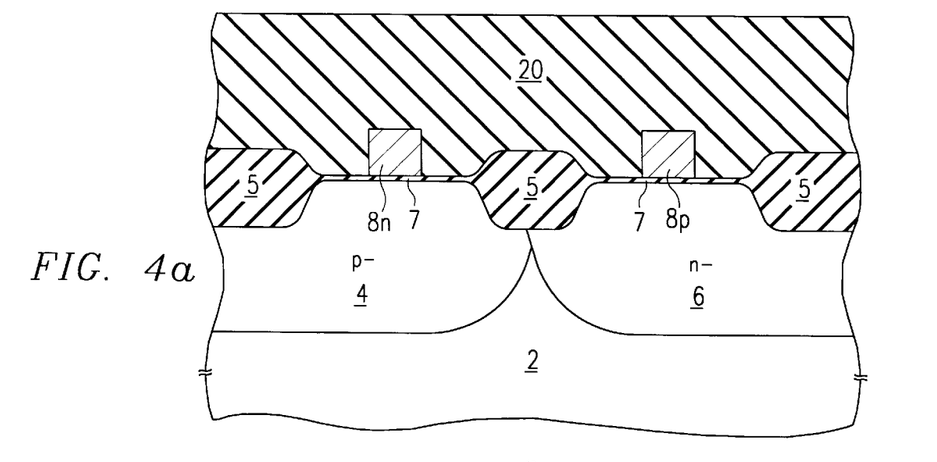
FIGS. 4a through 4d are cross-sectional views illustrating the construction of an integrated circuit according to the preferred embodiment of the present invention.

Referring now to FIGS. 4a through 4d, a method of fabricating the integrated circuit structure of FIGS. 2 and 3, according to the preferred embodiment of the present invention, will now be described in detail. At the point in the process illustrated in FIG. 4a, wells 4, 6 have been formed at a surface of substrate 2, with field oxide structures 5 formed at selected locations of this surface by way of LOCOS thermal oxidation. Conventional processing such as channel stop implants (under field oxide structures 5) and threshold voltage adjust implants (of n-type and p-type dopant into p-well 4 and n-well 6, respectively) will typically also have been performed at the state of manufacture illustrated in FIG. 4a. At the locations of the surface of wells 4, 6 at which field oxide structures 5 are not present, gate oxide layer 7 is thermally grown or deposited (or both), and gate structures 8n, 8p are formed by deposition and patterning of the selected gate conductor material at the desired locations, as shown in FIG. 4a. Preferably, gate structures 8n, 8p are polysilicon gates, with a protective cap oxide disposed at their upper surface.

According to the preferred embodiment of the present invention, doped insulating layer 20 is deposited overall, following the formation of gate structures 8n, 8p. The deposition of doped insulating layer 20 may be performed by chemical vapor deposition (CVD), for example by way of low pressure CVD (LPCVD), using the species appropriate for the formation of doped insulating layer 20. According to the preferred embodiment of the present invention, doped insulating layer 20 is formed of doped silicon dioxide.

In this exemplary embodiment, doped insulating layer 20 has two functions. Firstly, doped insulating layer 20 will serve as the dopant source for the formation of p-type source/drain regions 18p, and as such includes p-type dopant, such as boron, of a concentration that is adequate to provide the desired dopant concentration in source/drain regions 18p. Secondly, in this example, doped insulating layer 20 will serve as a hard mask for the ion implantation of n-type source/drain regions 18n and source/drain extensions 19n, and therefore is of a thickness adequate to stop the implanted ions from reaching the surface of well 6.

According to the preferred embodiment of the present invention, doped insulating layer 20 is patterned and etched from selected locations of the structure following its deposition. The patterning and etching may be performed by conventional techniques, including photolithographic exposure and developing of photoresist, followed by either a wet etch or plasma etch of doped insulating layer 20 at locations not protected by the remaining photoresist. The locations of the structure from which doped insulating layer 20 is etched include, in this example, those locations of well 4 at which n-type dopant is to be implanted.

Figure 4B:
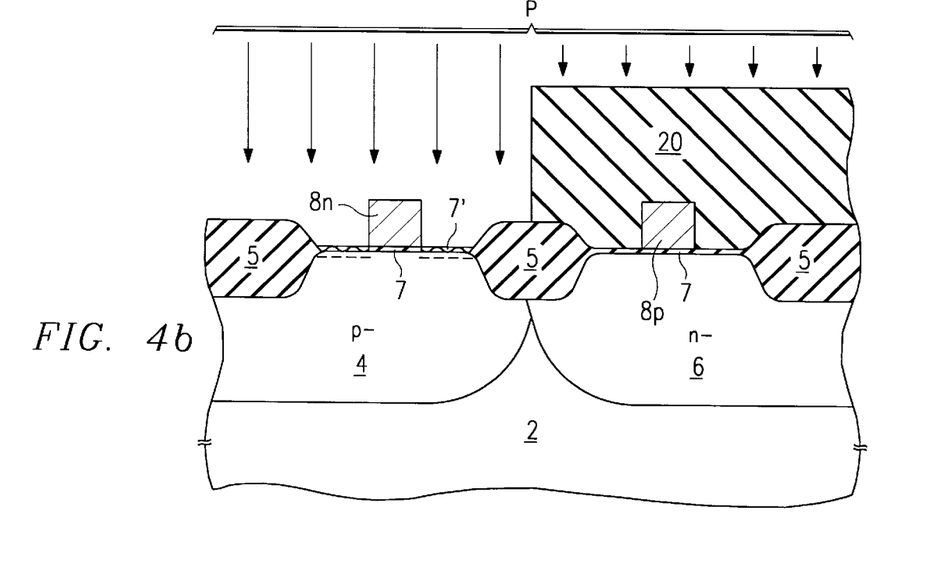

FIG. 4b illustrates the process stage after which doped insulating layer 20 has been etched to expose the locations, primarily at the surface of well 4, at which n-type dopant is to be implanted. As illustrated in FIG. 4, doped insulating layer 20 remains over well 6, protecting the locations of the integrated circuit structure at which p-channel transistors are to be formed. It is contemplated that the etching of doped insulating layer 20 will also remove gate dielectric layer 7 from the surface of well 4 at locations not protected by gate structure 8n, particularly if both doped insulating layer 20 and gate dielectric 7 are formed of the same material, such as silicon dioxide. In this case, it may be preferred to thermally grow a thin silicon dioxide layer 7' at the exposed locations of the surface of well 4 after the etch of doped insulating layer 20, to prevent "channeling" of dopant ions in the subsequent ion implantation operations. According to this embodiment of the invention, the reach-through ion implantation of n-type dopant for the eventual formation of source/drain extensions 19n is then performed, with the implanted species reaching into well 4 at locations that are not masked by field oxide structures 5, doped insulating layer 20, and gate structures 8n. As a result, the implant of this operation is self-aligned with the edges of gate structure 8n, as illustrated in FIG. 4b.

Figure 4C:
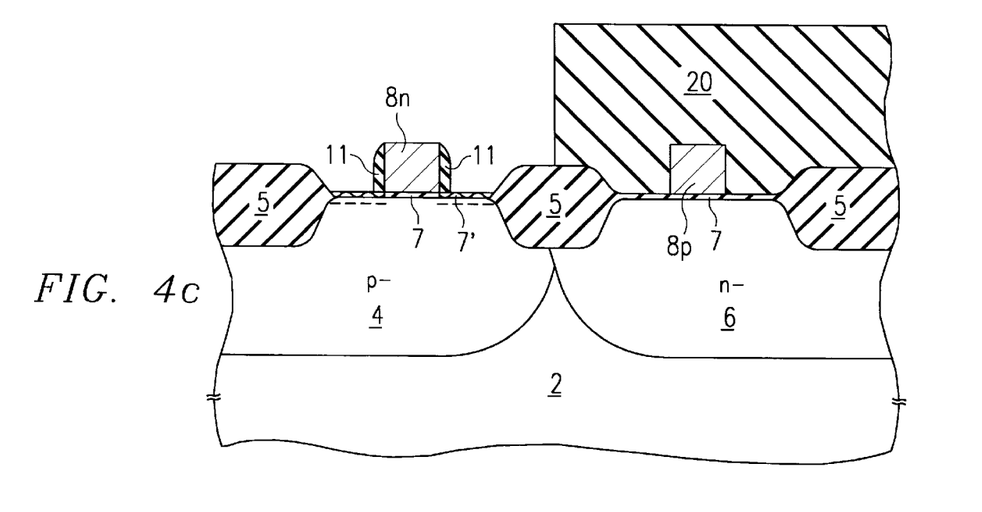

Following the reach-through implant for source/drain extensions 19n, in this graded junction example, sidewall filaments 11 are formed on the sides of exposed gate structures 8n, as illustrated in FIG. 4c. The formation of sidewall filaments may follow the conventional process of CVD of the sidewall dielectric material (e.g., silicon dioxide, silicon nitride, or both), followed by an anisotropic etch of the dielectric material to remove the deposited film from lateral surfaces, leaving filaments 11 behind as shown. Particularly in the event that sidewall filaments 11 are formed of silicon dioxide, doped insulating layer 20 may be thinned by this anisotropic etch; if such is the case, the thickness of doped insulating layer 20 as deposited should be selected to account for such thinning. Also, if the sidewall filament etch removes thin silicon dioxide layer 7', it may be preferred to replace this layer.

Figure 4D:
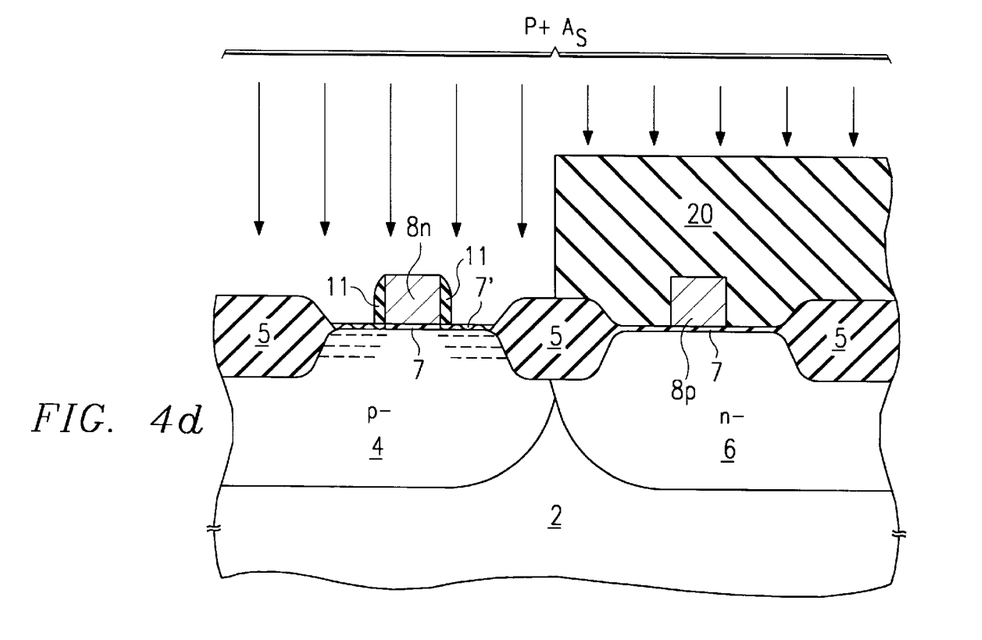

Once sidewall filaments 11 are in place, ion implantation of n-type dopant to form n-type source/drain regions 18n is performed. As necessary to form the relatively heavily-doped source/drain regions 18n, the dose and energy of this implant will be relatively high. Additionally, both arsenic and phosphorous species may be implanted, depending upon the desired junction profile. The n-type source/drain implant will be self-aligned to sidewall filaments 11, as illustrated in FIG. 4d.

Following the n-type source/drain implant, diffusion of the implanted dopant and also the dopant residing in doped insulating layer 20 is next performed. This diffusion operation is carried out by way of a high temperature anneal of the structure in a conventional furnace, for example in a nitrogen ambient. This high temperature processing causes the boron dopant that is contained within doped insulating layer 20, in this example, to diffuse into well 6 from the surface through gate dielectric layer 7, in a manner that is self-aligned relative to gate structure 8p, forming p-type source/drain regions 18p as shown in FIG. 2. At this same time, the anneal causes diffusion of the implanted n-type dopant in well 4 so as to form the desired n-type source/drain regions 18n and source/drain extensions 19n. Doped insulating layer 20 is then removed from the structure, resulting in the structure of FIGS. 2 and 3.

Following formation of source/drain regions 18n, 18p, and source/drain extensions 19p, and removal of doped insulating layer 20, conventional processing may then be performed to complete the integrated circuit, such processing including the formation of other integrated circuit elements, and the formation of interconnections among the various circuit elements. For example, silicide cladding of the exposed silicon surfaces of source/drain regions 18n, 18p and gate structures 8n, 8p, by deposition of a refractory metal followed by direct react silicidation, may be performed. Finally, the completed integrated circuit will be tested and packaged into its final usable form, in the conventional manner. It is contemplated that such additional processing will not materially change the structure and form of the transistors as illustrated in FIGS. 2 and 3.

The present invention provide important advantages and benefits in the fabrication of integrated circuits, particularly according to CMOS technology. Specifically, the use of the doped silicon dioxide layer as both an implant mask and also a dopant source eliminates a photolithography operation, which not only reduces the manufacturing cost of the integrated circuit, but also may improve the manufacturing yield by reducing the possibility of error and defects that arises in each photolithography operation.

Various alternatives are contemplated in connection with the present invention, relative to the preferred embodiment of the invention described hereinabove. Firstly, it is contemplated that a doped silicon dioxide layer may be used as an n-type dopant source (either of phosphorous, arsenic, or both) and as a mask for p-type source/drain implants, through selection of the various dopant species at each stage. Furthermore, abrupt junction n-channel transistors may alternatively be formed, by eliminating the "reach-through" implant and the formation of sidewall filaments. Still further in the alternative, transistors having graded junctions may be formed by way of the present invention, using a reach-through implant followed by formation of the sidewall filaments, prior to deposition of the doped silicon dioxide layer as the dopant source.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of fabricating an integrated circuit structure at a semiconducting surface of a body, comprising the steps of:

forming first and second gate structures over selected locations of first and second doped regions, respectively, of the semiconducting surface, the first doped region being of a first conductivity type and second doped region being of a second conductivity type;

forming a doped insulating layer over the first and second doped regions, the doped insulating layer including dopant of the first conductivity type;

removing the doped insulating layer from over the first doped region, so that the doped insulating layer remains over the second doped region;

implanting the first doped region with dopant ions of the second conductivity type, wherein the first gate structure and the remaining doped insulating layer masks portions of the first and second doped regions, respectively, from the implanting;

heating the semiconducting body to diffuse dopant from the remaining doped insulating layer into portions of the second doped region; and then removing the remaining doped insulating layer.

2. The method of claim 1, wherein the first conductivity type is p-type, and wherein the second conductivity type is n-type.

3. The method of claim 2, wherein the dopant of the first conductivity type included within the doped insulating layer comprises boron.

4. The method of claim 3, wherein the doped insulating layer comprises silicon dioxide.

5. The method of claim 4, wherein the step of forming the doped insulating layer comprises chemical vapor deposition.

6. The method of claim 1, wherein the doped insulating layer comprises silicon dioxide.

7. The method of claim 6, wherein the step of forming the doped insulating layer comprises chemical vapor deposition.

8. The method of claim 1, further comprising:

after the step of removing the doped insulating layer from over the first doped region, implanting the first doped region with dopant ions of the second conductivity type; and then forming sidewall filaments adjacent to the first gate structure, prior to the step of implanting the first doped region.

* * * * *